United States Patent [19] [11] 3,916,427
Ying et al. [45] Oct. 28, 1975

[54] WIDEBAND IMPATT DIODE

[75] Inventors: Robert S. Ying, Westminster; Don H. Lee, Agoura, both of Calif.

[73] Assignee: Hughes Aircraft Company, Culver City, Calif.

[22] Filed: Aug. 14, 1974

[21] Appl. No.: 497,545

[52] U.S. Cl. .................................... 357/13; 357/12
[51] Int. Cl.² .................... H01L 29/88; H01L 29/90
[58] Field of Search ............ 357/12, 13, 88, 89, 90, 357/91

[56] References Cited

OTHER PUBLICATIONS

Growder, Billy, "Applications of Ion Implantation for New Device Concepts," Jour. Vacuum Science & Tech., Vol. 8, No. 5, pp. 71, 3–23–71.

Seidel, Thomas et al., "Double–Drift–Region Ion–Implanted Millimeter Wave IMPATT Diodes," Proc. of IEEE, Vol. 59, No. 8, pp. 1222, Aug. 1971.

*Primary Examiner*—Michael J. Lynch
*Assistant Examiner*—E. Wojciechowicz
*Attorney, Agent, or Firm*—William J. Bethurum; W. H. MacAllister

[57] ABSTRACT

A $P^+PNN^+$ double drift IMPATT diode characterized by intermediate P and N type regions of unequal width and unequal carrier concentration. The conductance versus frequency characteristics of these two intermediate regions are shifted one from another by a predetermined amount on a common frequency scale and thus effectively combine to produce an operational bandwidth substantially greater than that of state of the art double drift IMPATT diodes.

6 Claims, 9 Drawing Figures

WIDEBAND IMPATT DIODE

FIELD OF THE INVENTION

This invention relates generally to impact avalanche transit time (IMPATT) diodes and more particularly to improved wideband double drift IMPATT diodes with a $P^+PNN^+$ structure which may be fabricated using either epitaxial processes or ion implantation processes or a combination of both.

BACKGROUND

Single drift IMPATT diodes characterized by the well known $N^+NP^+$ and $P^+PN^+$ diode structures have been available for several years and have a wide application in systems which operate at millimeter-wave frequencies. IMPATT diodes of this type have been fabricated using both silicon and gallium arsenide, although silicon IMPATT diodes are the more common solid state power source; and these diodes are useful as oscillators or amplifiers as is well known.

All IMPATT diodes derive their power output from the negative resistance characteristics of these devices, as is well known. This negative resistance is developed as the result of the phase delay of carriers drifting across the intermediate region of the diode, and such phase delay is caused by both avalanche generation and transit time delay in the diode structure. When an IMPATT diode is reverse biased, a high electric field (several hundred kilovolts per centimeter) occurs at the PN junction of the structure. Under this condition, carriers in the diode structure will acquire enough energy to knock valence electrons into the conduction band, producing hole-electron pairs in the structure. These new carriers in turn cause further carrier generation, until a critical field is reached and avalanche occurs in the diode.

Under steady state conditions, the maximum field across the PN junction of the IMPATT diode will be limited to the avalanche or critical field. But under transient conditions, if the field across the PN junction is moved rapidly from below a critical level to above it, and then below it again, the resulting avalanche current in the diode will still be increasing when the field has passed its maximum. Since the ionization process is not instantaneous, a phase delay is thus introduced between current and voltage in the diode and this is the delay caused by avalanche buildup within the diode. This current-voltage phase shift can be as great as 90° under small signal conditions. The carriers in the diode are swept out into the drift zone thereof under the influence of the high field, and the movement of carriers across this drift zone causes another 90° phase shift between current and voltage in the structure. This repeated shifting of phase between current and voltage in the diode allows the IMPATT diode to exhibit the required negative resistance over a microwave or millimeterwave frequency band.

PRIOR ART

More recently, there has been developed a double drift IMPATT device comprising a $P^+PNN^+$ structure which is more efficient than the above described single drift structure and utilizes both carrier species (electrons and holes) which are created in the avalanche process. This feature, together with the fact that the diode's active region is thicker and its junction area is larger, serves to increase the efficiency and power output of the device relative to the single drift $P^+NN^+$ structure.

Typically, state of the art double drift IMPATT structures are characterized by a carrier concentration which is relatively uniform and substantially equal in both the intermediate P and N type regions of the device. These regions may be fabricated using multiple epitaxial steps to successively grow the N and P type layers on an $N^+$ substrate. Alternatively, ion implantation techniques have been used to implant P type ions into an N epitaxial layer on $N^+$ substrate in order to achieve the ultimate $P^+PNN^+$ double drift IMPATT structure. Double drift IMPATT diodes exhibiting the above described impurity profile have been disclosed in various technical articles, among which include an article by Seidel et al, entitled "Double-Drift-Region Ion-Implanted Millimeter-Wave IMPATT Diodes," *Proceedings of the IEEE*, Vol. 59, No. 8, August, 1971, pages 1222–1228. The above Seidel et al article describes a double drift IMPATT structure fabricated using epitaxial and ion implantation techniques, whereas a subsequent article by B. E. Watts et al entitled "Double Drift Millimeter-Wave IMPATT Diodes prepared by Epitaxial Growth" *Electronics Letters*, May 3, 1973 pages 183–184 describes double drift IMPATT diodes fabricated using multiple epitaxial processes.

While the above state of the art double drift IMPATT diodes have exhibited a satisfactory operating bandwidth and power output for certain microwave and millimeter wave systems applications, the operational bandwidth of these devices has not been sufficiently wide for other systems applications. For example, the bandwidth of the above double drift IMPATT devices is not sufficiently wide for certain types of millimeter wave sweeper applications wherein the output frequency of an IMPATT diode sweep oscillator is swept through a particular frequency range by superimposing a sawtooth voltage waveform upon the IMPATT diode's DC operating bias.

THE INVENTION

The general purpose of this invention is to provide an improved double drift IMPATT diode whose operating bandwidth has been substantially increased relative to state of the art double drift diodes, without a substantial sacrifice in power output. To achieve this purpose, we have developed a novel $P^+PNN^+$ double drift diode structure characterized by intermediate P and N regions of unequal width and of predetermined and unequal impurity concentrations. These impurity concentrations cause these P and N regions to exhibit staggered (shifted) conductance versus frequency characteristics which are spaced apart on a common frequency scale by a predetermined amount. These characteristics actually couple (overlap) to thereby combine and produce a negative conductance over a wide frequency range. This combination of unequal impurity concentration and unequal width of the device's intermediate P and N regions serves to increase its operational bandwidth to a value on the order of 50 gigahertz. This bandwidth is approximately 10 gigahertz higher than the corresponding bandwidth of state of the art double drift IMPATT structures.

Accordingly, it is an object of the present invention to provide a novel $P^+PNN^+$ double drift IMPATT diode exhibiting an increased operational bandwidth.

Another objective is to provide an IMPATT diode of the type described whose increased bandwidth does not result in any substantial corresponding reduction in power output relative to state of the art double drift IMPATT diodes.

A feature of this invention is a provision of an IMPATT diode of the type described which may be fabricated using either multiple epitaxial steps or a combination of of epitaxial and ion implantation steps to carefully control the impurity concentration in the P and N intermediate regions of the device in accordance with a particular desired operating frequency.

These and other objects and features of the invention will become more readily apparent in the following description of the accompanying drawings.

BRIEF DESCRIPTION OF DRAWINGS

Referring now to FIG. 1, there is shown in FIG. 1*a* an $N^+$ N substructure consisting of an $N^+$ substrate 10 upon which an N type layer 12 was epitaxially grown using conventional epitaxial techniques. The $N^+$ substrate 10 is typically heavily doped silicon with a carrier concentration in excess of $2.5 \times 10^{18}$ $cm^{-3}$. The epitaxial layer 12 typically has a background doping level on the order of $8 \times 10^{16}$ $cm^{-3}$ and a thickness on the order of 1.1 micrometers.

Figure 1A:
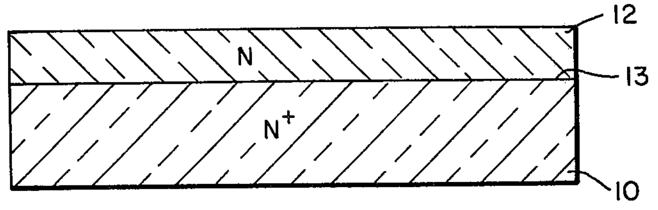
FIG. 1 is a schematic cross section diagram illustrating a preferred processing sequence for fabricating the device according to the invention.
Figure 1B:
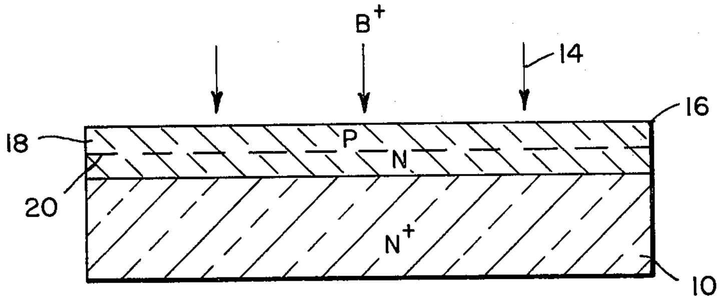

The epitaxial layer 12 of the structure in FIG. 1*a* was implanted with high energy boron ions 14 as shown in FIG. 1*b*, and these ions penetrated the surface 16 of the epitaxial layer 12 to thereby form a P type region 18, the thickness of which is defined by the PN junction 20. The depth of the implanted region 18 may be accurately controlled by controlling the energy of the incident boron ions. In the present structure, multiple boron implants were made in accordance with a predetermined multiple dose-energy schedule to compensate for the N type dopant as well as to form a substantially uniform carrier concentration in the P type region 18 on the order of $1.4 \times 10^{17}$ $cm^{-3}$.

Figure 1C:
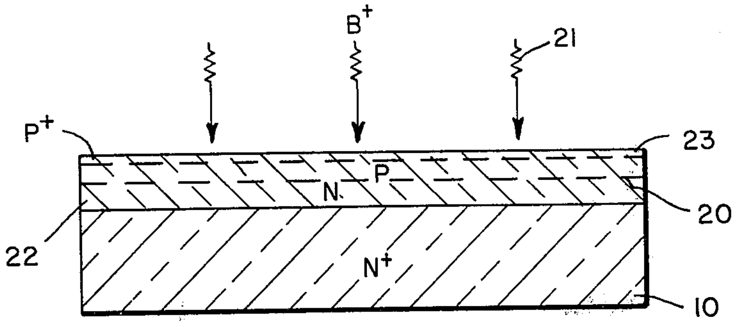

The structure in FIG. 1b was then transferred to a low temperature (~900°C) diffusion furnace wherein a shallow $P^+$ contact region 23 was formed by boron diffusion as shown in FIG. 1*c*. Simultaneously, the structure in FIG. 1*c* was annealed to remove the crystal lattice disorder caused by the above identified multiple boron implants.

Figure 1D:
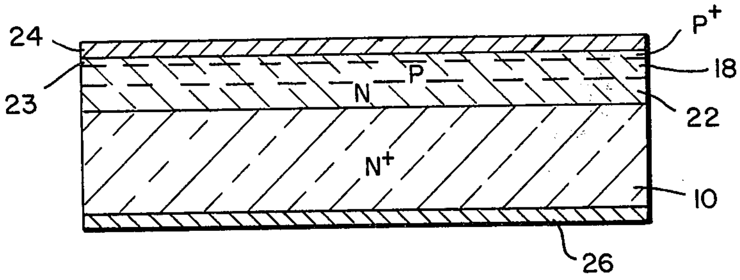

Next, the structure in FIG. 1*c* was transferred to a metalization deposition station wherein standard chromium-platinum-gold (CrPtAu) metalization layers 24 and 26 were formed on opposing surfaces of the structure as shown in FIG. 1*d*. The specific thicknesses of the four regions 10, 12, 18 and 23 of the double drift IMPATT structure in FIG. 1*d* are given directly in the impurity profile data of FIG. 2. It will be understood, however, that FIG. 1*d* is only a schematic cross sectional representation of one geometry for the four layer double drift IMPATT structure according to the invention, and the ultimate geometry of the structure may be any one of many well known mesa type geometries currently used for state of the art IMPATT structures.

Figure 2:
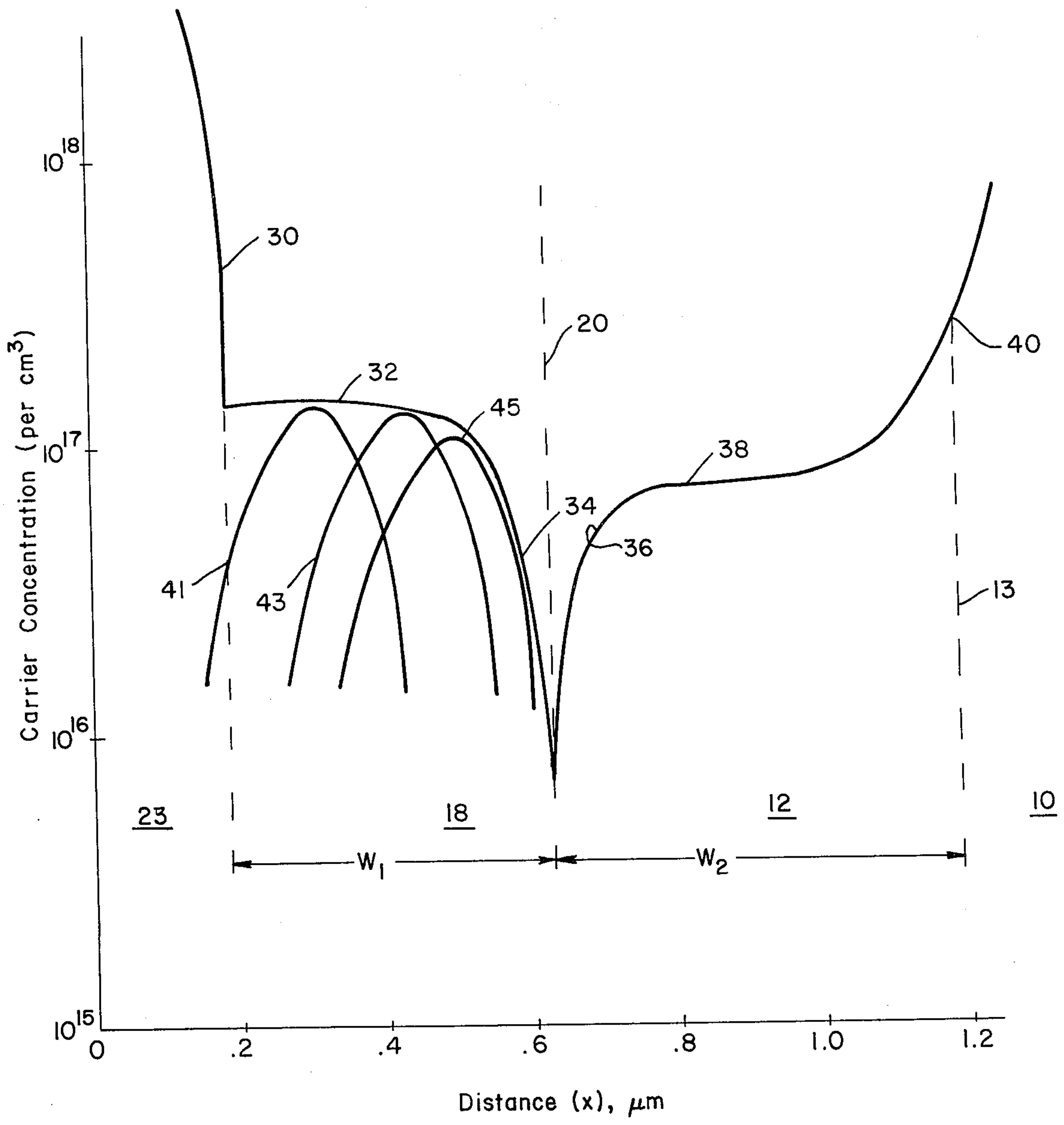
FIG. 2 is an impurity profile for the double drift IMPATT diode shown in FIG. 1*d*.

Referring now to FIG. 2, the impurity profile shown therein includes a sharply descending boundary 30 between the $P^+$ and P regions 23 and 18, respectively of the IMPATT structure. The boundary 30 joins a first plateau or intermediate concentration level 32 which was established by the above multiple implants 41, 43, and 45 of Gaussian distribution as is well known, and the line 23 defines the outer $P^+P$ boundary of the device. The first plateau 32 of the impurity profile is on the order of $1.4 \times 10^{17}$ $cm^{-3}$ and is joined to the sharply descending profile portion 34 which merges into the sharply ascending profile portion 36 at the PN junction 20 of the IMPATT device. The second plateau 38 of the impurity profile in FIG. 2 is an extension of the profile portion 36 and merges at point 40 with the substrate background impurity concentration at the second outer boundary 13 between the $N^+$ and N regions 10 and 12.

The second plateau 38 flattens out at about $8 \times 10^{16}$ $cm^{-3}$, which is approximately $6 \times 10^{17}$ $cm^{-3}$ less in impurity concentration than that of the first plateau 32 of the impurity profile.

It should be observed that the width $W_1$ of the P type layer 18 is on the order of about 0.42 micrometers, whereas the width $W_2$ of the N type region 12 is on the order of about 0.62 micrometers. It is the disparity in these two widths $W_1$ and $W_2$, coupled with the disparity in carrier concentrations of the two plateaus 32 and 38 (which span a large fraction of these regions) that combine to increase the operational bandwidth of the structure to about 120 percent – 125 percent of that of conventional state of the art double drift IMPATT structures.

Figure 3A:
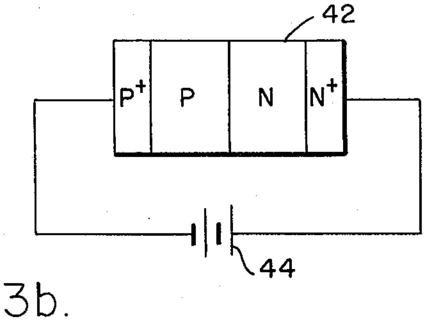
FIG. 3 illustrates the electric field profile for the device in FIG. 1*d* and its position relative to state of the art double drift structures.

Referring now to FIG. 3, there is shown in the schematic diagram of FIG. 3*a* the classic double drift IMPATT structure 42 which, in operation, receives a reverse bias 44 at its outer $P^+$ and $N^+$ regions of a magnitude sufficient to bias the intermediate PN junction to avalanche breakdown. In both the prior art double drift IMPATT structures and the IMPATT structure according to the present invention, the electric field E reaches zero at the $P^+P$ and $N^+N$ boundaries of the device. As is well known, this characteristic is known as the non-punch through mode of IMPATT operation. Under this condition $W_1N_{18} = W_2N_{12}$ where $N_{18}$ and $N_{12}$ are the impurity concentrations in regions 18 and 12, respectively, of the profile in FIG. 2.

Figure 3B:
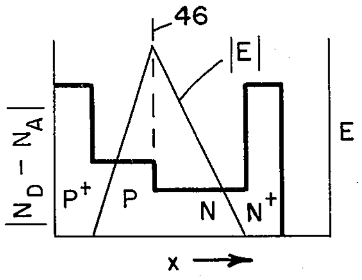
Figure 3C:
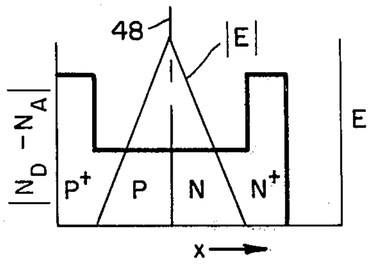

In FIG. 3*b*, the electric field profile for this mode of operation is non-symmetrical for the present invention because of the fact that the P type intermediate region is not as wide as the N type intermediate region. On the other hand, the symmetrical electric field profile shown in FIG. 3*c* is typical of state of the art double drift IMPATT diodes. In this case, the linear variations in field strength with distance on each side of the PN boundary 48 are substantially equal.

The above described increase in operational bandwidth may be partially explained as follows: The frequency at which the IMPATT structure on each side of the PN junction 20 operates with a negative conductance (−G) is dependent upon the widths $W_1$ and $W_2$ respectively in FIG. 2. However, the widths $W_1$ and $W_2$ are directly dependent upon the doping concentrations in the intermediate P and N type regions 18 and 12. So these doping concentrations, i.e., doping levels for plateaus 32 and 38 respectively, are chosen to be consistent with two spaced apart frequency ranges for which the structure's conductance is negative. If these two frequency ranges are staggered or spaced with respect to one another by a predetermined amount on a common frequency scale, the two conductance versus frequency characteristics for each side of the structure adjacent the PN junction 20 will in effect combine and produce a composite negative conductance versus frequency characteristic. This latter composite characteristic has a bandwidth 120 percent – 125 percent greater than state of the art double drift IMPATT diodes with equal widths and equal impurity concentrations for the intermediate P and N type regions thereof.

The frequency of operation for each side of the structure adjacent the PN junction 20 is related to the impurity concentration in accordance with the following set of equations:

$$W_1 \alpha \left[\frac{1}{N_{18}}\right]^{1/2} \qquad \text{Equation (Eq.) 1}$$

and $$W_2 \alpha \left[\frac{1}{N_{18}}\right]^{1/2} \qquad \text{Eq. 2}$$

where $N_{18}$ and $N_{12}$ are the impurity concentrations in regions 18 and 12 respectively.

And the widths $W_1$ and $W_2$ are also related to the transit time of carriers, $\tau_1$ and $\tau_2$, in the regions 18 and 12 by the following expressions:

$$\tau_1 = \frac{W_1}{V_{sh}} \qquad \text{Eq. 3}$$

and $$\tau_2 = \frac{W_2}{V_{se}} \qquad \text{Eq. 4}$$

where $V_{sh}$ and $V_{se}$ are equal to the saturation velocities of holes and electrons respectively in these regions.

But since $\tau_1$ and $\tau_2$ are related to frequency by the expression $$f = \frac{1}{2\tau} \qquad \text{Eq. 5}$$

then $\tau_1$ and $\tau_2$ may be initially chosen to correspond to two center frequencies spaced apart on a common frequency scale by a predetermined amount. Then, the unequal doping concentrations $N_{18}$ and $N_{12}$ in Equations 1 and 2 above can be fixed so that the corresponding values of $W_1$ and $W_2$ will yield the proper values of $\tau_1$ and $\tau_2$ in Equations 3 and 4 above.

Figure 4:
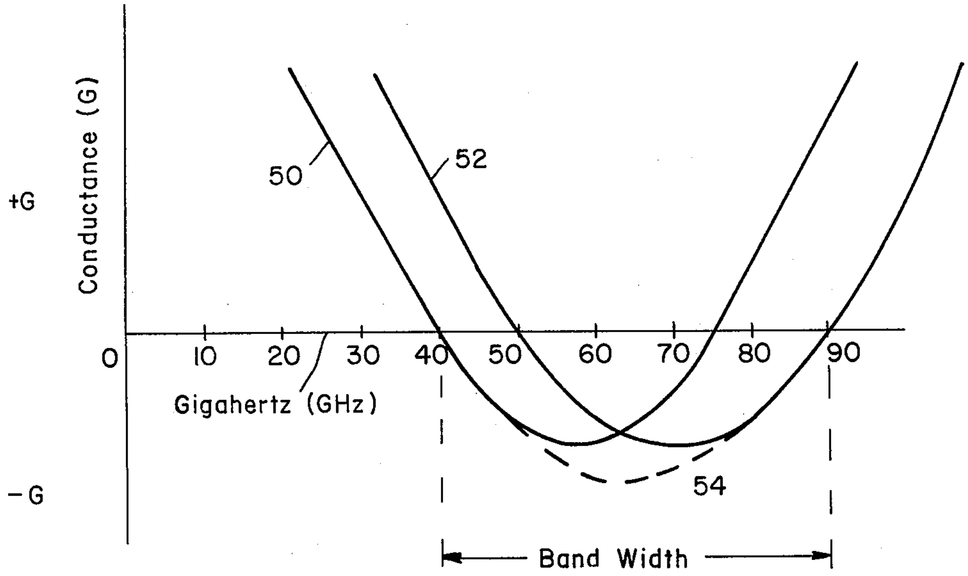
FIG. 4 is a plot of conductance versus frequency for the double drift IMPATT diode illustrated in FIG. 1*d*.

Referring now to FIG. 4, there is shown a first conductance-versus-frequency characteristic 50 for the low frequency side of the diode corresponding to width $W_2$. It is seen that the conductance for this characteristic is negative between about 40 gigahertz and 75 gigahertz. The shifted conductance-versus-frequency characteristic 52 corresponding to the width $W_1$ on the other side of the PN junction 20 exhibits a negative conductance as shown between about 50 gigahertz and 90 gigahertz. Therefore, the two curves 50 and 52 may be added as shown in FIG. 4 to provide a resulting composite conductance-versus-frequency characteristic 54 which has a negative conductance, —G, between about 40 and 90 gigahertz.

While there has been described a preferred impurity profile and a corresponding preferred mode of IMPATT operation, this profile may be varied within the scope of the invention and still provide certain staggered conductance-versus-frequency characteristics which are useful to increase the operational bandwidth relative to state of the art structures. For example, it is possible for the impurity concentration to be greater in the N region 12 than in the P region 18, and in this situation the width of the N region 12 will be less than that of the P region 18. For this example, the corresponding staggered conductance-versus-frequency curves will extend the operational bandwidth for the structure over that of symmetrically doped double drift state of the art IMPATT devices.

However, the profile shown in FIG. 2 is a preferred impurity profile and describes a profile corresponding to the best mode of operation found to date for the IMPATT semiconductor device shown in FIG. 1d. For non-punch through operation in either of the above examples of unequal impurity concentration and unequal intermediate region widths $W_1$ and $W_2$, ,it is required that the electric field be reduced to zero at or before reaching the two outer device boundaries 13 and 23.

Finally, it is to be understood that the impurity profile in FIG. 2 can be realized equally well with multiple epitaxial steps and without relying upon ion implantation doping.

What is claimed is:

1. A $P^+PNN^+$ double drift IMPATT diode with an improved bandwidth and including:

a. successive layers of $P^+$, P, N and $N^+$ impurity concentration and having a central PN junction from which a depletion region spreads under reverse bias, said layers further defining first and second outer boundaries at the $P^+$ P and N $N^+$ interfaces respectively at which the electric field is zero during IMPATT operation, b. said central PN junction and said first outer boundary defining a first region of width $W_1$ in which P type carriers are present, c. said central PN junction and said second outer boundary defining a second region of width $W_2$ in which N type carriers are present, and d. the carrier concentration in said first and second regions being unequal in magnitude and in turn establishing unequal values for $W_1$ and $W_2$, said carrier concentration and width of each intermediate P and N region selected to insure that no punch through occurs at said $P^+$ P and N $N^+$ interfaces, whereby two staggered and overlapping conductance versus frequency characteristics for said first and second regions of said structure determine the operational bandwidth of the diode including all frequencies at which the conductance in either said first or second regions is negative.

2. The device defined in claim 1 wherein the impurity concentration in said first region is greater than the impurity concentration in said second region by a predetermined amount which determines the frequency spacing of said two conductance-versus-frequency characteristics.

3. The device defined in claim 1 wherein the impurity concentration in said first region approaches a substantially constant plateau on the order of $1.4 \times 10^{17}$ carriers per cubic centimeter and the impurity concentration in said second region approaches a substantially constant plateau at the level of approximately $1.75 \times 10^{16}$ carriers per cubic centimeter.

4. An improved wideband double drift IMPATT diode including:

a. a first, substrate region of one conductivity type adjacent to a second region of said one conductivity type and with a carrier concentration less than that of said first region, b. a third region adjacent said second region and having a conductivity type opposite to that of said first and second regions and defining a PN junction, c. a fourth region of opposite conductivity type adjacent to said third region and having a carrier concentration higher than that of said third region, and d. the impurity profile across said regions being defined by one plateau in said second region at one relatively constant level of impurity concentration and by another plateau in said third region and at another relatively constant level of impurity concentration higher than that of said first level, whereby the unequal impurity concentrations in said second and third regions define widths $W_1$ and $W_2$ across which carriers in these regions must be swept before the electric field therein falls to zero under a predetermined bias; said widths $W_1$ and $W_2$ determining two shifted conductance-versus-frequency characteristics for said second and third regions respectively which in turn control the operational bandwidth of said diode.

5. The diode defined in 4 wherein the impurity concentration in said third region is greater than the impurity concentration in said second region, whereby $W_1$ is less than $W_2$.

6. The diode defined in claim 4 wherein said first region is of $N^+$, said second region of N, said third region of P and said fourth region of $P^+$ relative impurity concentration levels.

* * * * *